(12) United States Patent
Zhao et al.

(10) Patent No.: US 11,296,163 B2
(45) Date of Patent: Apr. 5, 2022

(54) OLED DISPLAY PANEL AND OLED DISPLAY DEVICE

(71) Applicant: Shenzhen China Star Optoelectronics Semiconductor Display Technology Co., Ltd., Guangdong (CN)

(72) Inventors: Shuning Zhao, Guangdong (CN); Zhenguo Lin, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/980,913

(22) PCT Filed: May 27, 2020

(86) PCT No.: PCT/CN2020/092646
§ 371 (c)(1),
(2) Date: Sep. 15, 2020

(87) PCT Pub. No.: WO2021/212600
PCT Pub. Date: Oct. 28, 2021

(65) Prior Publication Data
US 2021/0335941 A1    Oct. 28, 2021

(51) Int. Cl.
*H01L 27/32* (2006.01)
*H01L 29/786* (2006.01)
*H01L 29/24* (2006.01)
*H01L 27/12* (2006.01)
*H01L 51/52* (2006.01)

(52) U.S. Cl.
CPC ...... *H01L 27/3248* (2013.01); *H01L 27/3258* (2013.01); *H01L 27/3262* (2013.01); *H01L 27/1225* (2013.01); *H01L 29/24* (2013.01); *H01L 29/7869* (2013.01);
(Continued)

(58) Field of Classification Search
CPC ............ H01L 27/3248; H01L 27/3262; H01L 29/78696; H01L 27/3258; H01L 27/326; H01L 29/78669; H01L 29/78678
See application file for complete search history.

(56) References Cited

U.S. PATENT DOCUMENTS 10,930,723 B2 * 2/2021 Shim .................. H01L 27/1255
2001/0045565 A1 * 11/2001 Yamazaki .......... H01L 27/3248
257/89
(Continued)

FOREIGN PATENT DOCUMENTS

CN     1779990     5/2006
CN     101859793   10/2010
(Continued)

*Primary Examiner* — Victoria K. Hall (57) ABSTRACT

The present disclosure provides an OLED display panel including a substrate, and a gate electrode, an active layer, a source electrode, and a drain electrode of a TFT device disposed on the substrate, and an anode of an OLED device disposed on the substrate; wherein the source electrode, the drain electrode, and the anode are formed in a same layer, and the anode is connected to the source electrode. The source electrode, the drain electrode, and the anode are arranged in a same layer, so that the source electrode, the drain electrode, and the anode are formed through a single process, thereby simplifying a manufacturing process and saving costs.

14 Claims, 2 Drawing Sheets

(52) U.S. Cl.
CPC .... *H01L 29/78696* (2013.01); *H01L 51/5206* (2013.01); *H01L 51/5253* (2013.01)

(56) References Cited

U.S. PATENT DOCUMENTS

| | | | |
|---|---|---|---|
| 2003/0062826 A1* | 4/2003 | Seo | H01L 51/5284 313/504 |
| 2003/0080338 A1* | 5/2003 | Yamazaki | H01L 51/5215 257/59 |
| 2003/0201716 A1* | 10/2003 | Yamazaki | H01L 27/322 313/506 |
| 2004/0080263 A1* | 4/2004 | Yamazaki | H01L 27/3265 313/499 |
| 2005/0073247 A1* | 4/2005 | Yamazaki | H01L 33/36 313/503 |
| 2005/0212420 A1* | 9/2005 | Sakakura | H05B 33/04 313/512 |
| 2005/0255617 A1* | 11/2005 | Yamazaki | H01L 27/3244 438/22 |
| 2006/0054894 A1* | 3/2006 | Miyake | G09G 3/3233 257/72 |
| 2006/0091785 A1 | 5/2006 | Lee et al. | |
| 2006/0186804 A1* | 8/2006 | Sakakura | H01L 51/5206 313/506 |
| 2006/0220542 A1* | 10/2006 | Suh | H01L 27/3248 313/506 |
| 2007/0085847 A1* | 4/2007 | Shishido | G09G 3/3225 345/204 |
| 2007/0090365 A1* | 4/2007 | Hayashi | H01L 27/1225 257/72 |
| 2009/0039353 A1* | 2/2009 | Jun | H01L 27/3246 257/72 |
| 2010/0200861 A1* | 8/2010 | Lee | H01L 27/3276 257/72 |
| 2011/0115839 A1* | 5/2011 | Takahashi | H01L 27/3248 345/698 |
| 2011/0303918 A1* | 12/2011 | Im | H01L 27/1225 257/59 |
| 2012/0097957 A1* | 4/2012 | Kim | H01L 51/5265 257/59 |
| 2012/0146030 A1* | 6/2012 | You | H01L 27/3279 257/59 |
| 2012/0146031 A1* | 6/2012 | Lee | H01L 51/56 257/59 |
| 2012/0223315 A1* | 9/2012 | Uemura | H01L 29/78669 257/72 |
| 2012/0248451 A1* | 10/2012 | Sone | H01L 29/7869 257/59 |
| 2014/0131696 A1* | 5/2014 | Ono | H01L 29/66969 257/40 |
| 2014/0179051 A1* | 6/2014 | Lee | H01L 27/3265 438/73 |
| 2015/0102338 A1* | 4/2015 | Kong | H01L 29/41758 257/43 |
| 2015/0279907 A1* | 10/2015 | Sato | H01L 27/3248 257/40 |
| 2015/0279916 A1* | 10/2015 | Takamaru | H01L 51/5206 257/40 |
| 2016/0141342 A1* | 5/2016 | Zhang | G02F 1/133602 257/72 |
| 2016/0141346 A1* | 5/2016 | You | H01L 51/5215 257/40 |
| 2016/0190454 A1* | 6/2016 | You | H01L 27/3265 257/40 |
| 2016/0204134 A1* | 7/2016 | Hu | H01L 27/1288 349/106 |
| 2016/0240599 A1* | 8/2016 | Li | H01L 27/124 |
| 2016/0315104 A1* | 10/2016 | Han | H01L 29/22 |
| 2016/0351599 A1* | 12/2016 | Zhang | H01L 27/32 |
| 2016/0380006 A1* | 12/2016 | Uchida | H01L 27/1255 257/43 |
| 2017/0033237 A1* | 2/2017 | Abe | G09G 3/3225 |
| 2017/0141141 A1* | 5/2017 | Ge | H01L 27/1288 |
| 2017/0186878 A1* | 6/2017 | Xiao | G03F 1/22 |
| 2017/0194405 A1* | 7/2017 | Tang | H01L 27/1251 |
| 2017/0358637 A1* | 12/2017 | Lee | H01L 27/3262 |
| 2018/0040639 A1* | 2/2018 | Lee | H01L 27/127 |
| 2018/0097053 A1* | 4/2018 | Park | H01L 27/3262 |
| 2018/0122835 A1* | 5/2018 | Watakabe | H01L 27/1251 |
| 2018/0151633 A1* | 5/2018 | Won | H01L 27/3276 |
| 2018/0190686 A1* | 7/2018 | Zhang | H01L 27/1288 |
| 2018/0331132 A1* | 11/2018 | Zeng | H01L 29/786 |
| 2019/0115561 A1* | 4/2019 | Tang | H01L 27/124 |
| 2019/0172884 A1* | 6/2019 | Shim | H01L 27/3272 |
| 2020/0135464 A1* | 4/2020 | Kesapragada | C23C 14/046 |
| 2020/0176483 A1* | 6/2020 | Wang | H01L 23/53204 |
| 2021/0020755 A1* | 1/2021 | Yan | H01L 29/78618 |

FOREIGN PATENT DOCUMENTS

| | | |
|---|---|---|
| CN | 102456843 | 5/2012 |
| CN | 102544054 | 7/2012 |
| CN | 102569665 | 7/2012 |
| CN | 109887952 | 6/2019 |

\* cited by examiner

OLED DISPLAY PANEL AND OLED DISPLAY DEVICE

RELATED APPLICATIONS

This application is a National Phase of PCT Patent Application No. PCT/CN2020/092646 having International filing date of May 27, 2020, which claims the benefit of priority of Chinese Patent Application No. 202010332912.4 filed on Apr. 24, 2020. The contents of the above applications are all incorporated by reference as if fully set forth herein in their entirety.

FIELD AND BACKGROUND OF THE INVENTION

The present disclosure relates to the field of organic light emitting diode (OLED) display technologies, and particularly relates to an OLED display panel and an OLED display device.

In conventional OLED display panels, a source electrode, a drain electrode, and an anode are formed through two steps and two masks, respectively. The formation of the source electrode, the drain electrode, and the anode by the two masks increases production costs. At the same time, it also requires longer production time. Therefore, the conventional OLED display panels have a technical problem that multiple masks need to be used.

SUMMARY OF THE INVENTION

Embodiments of the present disclosure provides an OLED display panel and an OLED display device, which can relieve the technical problem that the conventional OLED display panels need to use multiple masks.

An embodiment of the present disclosure provides an OLED display panel, including:

a substrate, and a gate electrode, an active layer, a source electrode, and a drain electrode of a thin film transistor (TFT) device disposed on the substrate, and an anode of an OLED device disposed on the substrate;

wherein the source electrode, the drain electrode, and the anode are formed in a same layer, and the anode is connected to the source electrode.

In the OLED display panel provided by an embodiment of the present disclosure, the TFT device further includes:

a gate insulating layer at least covering the gate electrode, and the active layer being disposed on the gate insulating layer;

a passivation layer disposed on the gate insulating layer and covering the active layer;

a planarization layer disposed on the passivation layer;

a source via penetrating the passivation layer and the planarization layer to a first doped region of the active layer, wherein the source electrode is disposed on an upper surface of the planarization layer, and the source electrode is connected to the first doped region through the source via; and a drain via penetrating the passivation layer and the planarization layer to a second doped region of the active layer, wherein the drain electrode is disposed on a surface of the planarization layer, and the drain electrode is connected to the second doped region through the drain via.

In the OLED display panel provided by an embodiment of the present disclosure, the source electrode is in contact with the first doped region of the active layer through the source via, and the drain electrode is in contact with the second doped area of the active layer through the drain via; wherein the source electrode includes a first source portion disposed above the planarization layer and a second source portion disposed in the source via, and the drain electrode includes a first drain portion disposed above the planarization layer and a second drain portion disposed in the drain via.

In the OLED display panel provided by an embodiment of the present disclosure, the active layer is disposed on the gate insulating layer, the second source portion is in contact with a side surface of the first doped region, and a contact portion of the second source portion is disposed on the gate insulating layer.

In the OLED display panel provided by an embodiment of the present disclosure, the active layer is disposed on the gate insulating layer, the second drain portion is in contact with a side surface of the second doped region, and a contact portion of the second drain portion is disposed on the gate insulating layer.

In the OLED display panel provided by an embodiment of the present disclosure, the active layer includes a channel region, the first doped region, and the second doped region, the first doped region and the second doped region are positioned at both ends of the channel region, and an area of an orthographic projection of the active layer of the first doped region on the substrate is equal to an area of an orthographic projection of the active layer of the second doped region on the substrate.

In the OLED display panel provided by an embodiment of the present disclosure, the active layer is made of at least one of indium gallium zinc oxide, indium tin zinc oxide, indium gallium tin oxide, and indium gallium zinc tin oxide.

In the OLED display panel provided by an embodiment of the present disclosure, a thickness of each of the source electrode, the drain electrode, and the anode is equal to any value ranging between 500 angstroms and 10000 angstroms.

In the OLED display panel provided by an embodiment of the present disclosure, the source electrode, the drain electrode, and the anode have a single-layer structure, and the source electrode, the drain electrode, and the anode are made of any one of molybdenum, aluminum, copper, and titanium.

In the OLED display panel provided by an embodiment of the present disclosure, the source electrode, the drain electrode, and the anode have a multilayer structure, and the source electrode, the drain electrode, and the anode are made of any one of molybdenum/aluminum/molybdenum, aluminum/molybdenum, molybdenum/copper, and molybdenum titanium/copper.

An embodiment of the present disclosure provides an OLED display device including an OLED display panel, and the OLED display panel includes:

a substrate, and a gate electrode, an active layer, a source electrode, and a drain electrode of a thin film transistor (TFT) device disposed on the substrate, and an anode of an OLED device disposed on the substrate;

wherein the source electrode, the drain electrode, and the anode are formed in a same layer, and the anode is connected to the source electrode.

In the OLED display device provided by an embodiment of the present disclosure, the TFT device further includes:

a gate insulating layer at least covering the gate electrode, and the active layer being disposed on the gate insulating layer;

a passivation layer disposed on the gate insulating layer and covering the active layer;

a planarization layer disposed on the passivation layer;

a source via penetrating the passivation layer and the planarization layer to a first doped region of the active layer, wherein the source electrode is disposed on an upper surface of the planarization layer, and the source electrode is connected to the first doped region through the source via; and a drain via penetrating the passivation layer and the planarization layer to a second doped region of the active layer, wherein the drain electrode is disposed on a surface of the planarization layer, and the drain electrode is connected to the second doped region through the drain via.

In the OLED display device provided by an embodiment of the present disclosure, the source electrode is in contact with the first doped region of the active layer through the source via, and the drain electrode is in contact with the second doped area of the active layer through the drain via; wherein the source electrode includes a first source portion disposed above the planarization layer and a second source portion disposed in the source via, and the drain electrode includes a first drain portion disposed above the planarization layer and a second drain portion disposed in the drain via.

In the OLED display device provided by an embodiment of the present disclosure, the active layer is disposed on the gate insulating layer, the second source portion is in contact with a side surface of the first doped region, and a contact portion of the second source portion is disposed on the gate insulating layer.

In the OLED display device provided by an embodiment of the present disclosure, the active layer is disposed on the gate insulating layer, the second drain portion is in contact with a side surface of the second doped region, and a contact portion of the second drain portion is disposed on the gate insulating layer.

In the OLED display device provided by an embodiment of the present disclosure, the active layer includes a channel region, the first doped region, and the second doped region, the first doped region and the second doped region are positioned at both ends of the channel region, and an area of an orthographic projection of the active layer of the first doped region on the substrate is equal to an area of an orthographic projection of the active layer of the second doped region on the substrate.

In the OLED display device provided by an embodiment of the present disclosure, the active layer is made of at least one of indium gallium zinc oxide, indium tin zinc oxide, indium gallium tin oxide, and indium gallium zinc tin oxide.

In the OLED display device provided by an embodiment of the present disclosure, a thickness of each of the source electrode, the drain electrode, and the anode is equal to any value ranging between 500 angstroms and 10000 angstroms.

In the OLED display device provided by an embodiment of the present disclosure, the source electrode, the drain electrode, and the anode have a single-layer structure, and the source electrode, the drain electrode, and the anode are made of any one of molybdenum, aluminum, copper, and titanium.

In the OLED display device provided by an embodiment of the present disclosure, the source electrode, the drain electrode, and the anode have a multilayer structure, and the source electrode, the drain electrode, and the anode are made of any one of molybdenum/aluminum/molybdenum, aluminum/molybdenum, molybdenum/copper, and molybdenum titanium/copper.

Beneficial effects: the OLED display panel provided by the embodiments of the present disclosure includes a substrate, and a gate electrode, an active layer, a source electrode, and a drain electrode of a thin film transistor (TFT) device disposed on the substrate, and an anode of an OLED device disposed on the substrate; wherein the source electrode, the drain electrode, and the anode are formed in a same layer, and the anode is connected to the source electrode. The source electrode, the drain electrode, and the anode are arranged in a same layer, and the source electrode and the drain electrode are respectively in contact with the active layer through the source via and the drain via. Under a premise of ensuring a normal switching function of the transistor, the source-drain electrodes and the anode are formed through a single process, which relieves the technical problem that the conventional OLED display panels need to use multiple masks.

BRIEF DESCRIPTION OF THE SEVERAL VIEWS OF THE DRAWINGS

Following describes specific implementations of the present disclosure in detail with reference to accompanying drawings, which will make the technical solutions and other beneficial effects of the present disclosure obvious.

DESCRIPTION OF SPECIFIC EMBODIMENTS OF THE INVENTION

The technical solutions in the embodiments of the present disclosure will be clearly and completely described with reference to the accompanying drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative work fall into a protection scope of the present disclosure.

In the description of the present disclosure, it should be understood that orientational or positional relationships indicated by terms, such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc., are based on the orientational or positional relationships shown in the drawings, and are merely for the convenience of describing the present disclosure and simplifying the description, and does not indicate or imply that the device or element referred to must have a specific orientation, be constructed and operate in a specific orientation, and therefore cannot be understood as a limitation on the present disclosure. In addition, the terms "first" and "second" are used herein for purposes of description, and should not be interpreted as indication or implication of relative importance or implicitly indicating a number of technical features indicated. Thus, the features defined as "first" and "second" may explicitly or implicitly include one or more of the features. In the description of the present disclosure, the meaning of "plurality" is two or more, unless specifically defined otherwise.

In description of the present disclosure, it should be noted, the terms "install", "connect", and "couple" shall be understood broadly, unless otherwise explicitly stated and defined, and may be, for example, a fixed connection, a detachable connection, or an integral connection; a mechanical connection or an electrical connection; directly connected or indirectly connected through an intermediate medium; an internal connection of the two elements. The specific meanings of the above terms in the present disclosure can be understood in the specific circumstances for those skilled in the art.

In the present disclosure, unless specifically stated and defined otherwise, that a first feature is "on" or "under" a second feature may include: the first feature and the second feature are not in direct contact but are contacted by another feature between them. Furthermore, that the first feature is "on", "above", or "upon" the second feature includes that the first feature is directly above and obliquely above the second feature, or merely indicates that the first feature is higher in level than the second feature. That the first feature is "under" or "below" the second feature includes that the first feature is directly below and obliquely below the second feature, or merely indicates that the first feature is lower in level than the second feature.

Following disclosure provides various different implementations or examples for implementing different structures of the present disclosure. To simplify the disclosure of the present disclosure, components and settings of specific examples are described below. Of course, they are merely examples and are not intended to limit the present disclosure. In addition, the present disclosure may repeat reference numbers and/or reference letters in different examples, and such repetition is for purpose of simplicity and clarity, and does not indicate relationship between the various embodiments and/or settings discussed. In addition, examples of various specific processes and materials are provided in the present disclosure, but those of ordinary skill in the art may be aware of application of other processes and/or other materials.

Figure 1:
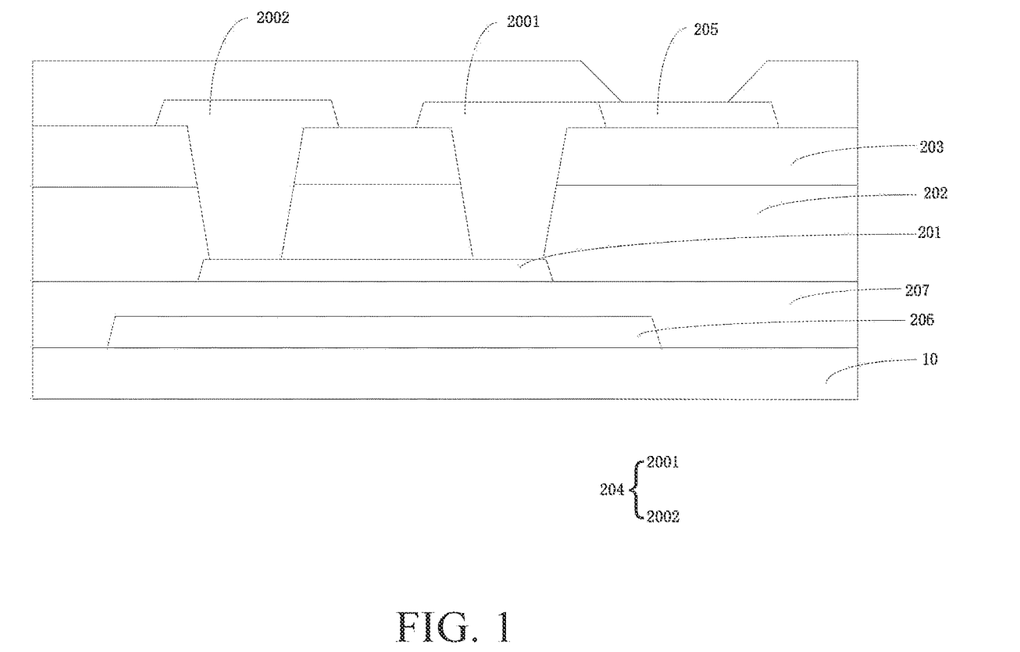
FIG. 1 is a first schematic sectional view of an OLED display panel provided by an embodiment of the present disclosure.

As shown in FIG. 1, an OLED display panel provided by an embodiment of the present disclosure includes a substrate 10, and a gate electrode 206, an active layer 201, a source electrode 2001, and a drain electrode 2002 of a thin film transistor (TFT) device disposed on the substrate, and an anode 205 of an OLED device disposed on the substrate. Wherein the source electrode 2001, the drain electrode 2002, and the anode 205 are formed in a same layer, and the anode 205 is connected to the source electrode 2001.

In the embodiment, the OLED display panel includes the substrate 10, and the gate electrode 206, the active layer 201, the source electrode 2001, and the drain electrode 2002 of the thin film transistor (TFT) device disposed on the substrate, and the anode 205 of the OLED device disposed on the substrate; wherein the source electrode 2001, the drain electrode 2002, and the anode 205 are formed in a same layer, and the anode 205 is connected to the source electrode 2001. The source electrode 2001, the drain electrode 2002, and the anode 205 are arranged in a same layer, and the source electrode 2001 and the drain electrode 2002 are respectively contacted with the active layer 201 through a source via and a drain via. Under a premise of ensuring a normal switching function of the transistor, the source-drain electrodes and the anode are formed through a single process, which relieves the technical problem that the conventional OLED display panels need to use multiple masks.

Wherein, the source via penetrates the passivation layer 202 and the planarization layer 203.

Wherein, the drain via also penetrates the passivation layer 202 and the planarization layer 203.

In an embodiment, the TFT device further includes a gate insulating layer 207, a passivation layer 202, a planarization layer 203, a source via, and a drain via. The gate insulating layer 207 at least covers the gate electrode 206. The active layer 201 is disposed on the gate insulating layer 207. The passivation layer 202 is disposed on the gate insulating layer 207 and covers the active layer 201. The planarization layer 203 is disposed on the passivation layer 202. The source via penetrates the passivation layer 202 and the planarization layer 203 to a first doped region of the active layer 201, the source electrode 2001 is disposed on an upper surface of the planarization layer 203, and the source electrode 2001 is connected to the first doped region through the source via. The drain via penetrates the passivation layer 202 and the planarization layer 203 to a second doped region of the active layer 201, the drain electrode 2002 is disposed on a surface of the planarization layer 203, and the drain electrode 2002 is connected to the second doped region through the drain via.

Wherein, the anode 205 may be arranged on a same plane as the source electrode 2001.

Wherein, the anode 205 may also be arranged on a different plane from the source electrode 2001.

Wherein, a shape of the anode 205 may be different from a shape of the source electrode 2001.

In an embodiment, the source electrode 2001 is in contact with the first doped region of the active layer 201 through the source via, and the drain electrode 2002 is in contact with the second doped area of the active layer 201 through the drain via. Wherein, the source electrode 2001 includes a first source portion disposed above the planarization layer 203 and a second source portion disposed in the source via, and the drain electrode 2002 includes a first drain portion disposed above the planarization layer 203 and a second drain portion disposed in the drain via.

Wherein, the first source portion is in contact with the first doped region of the active layer 201, and the first drain portion is in contact with the second doped region of the active layer 201.

In an embodiment, a source-drain layer 204 includes the source electrode 2001 and the drain electrode 2002, an anode layer includes the anode 205, and the source-drain layer 204 and the anode layer are arranged in a same layer.

Figure 2:
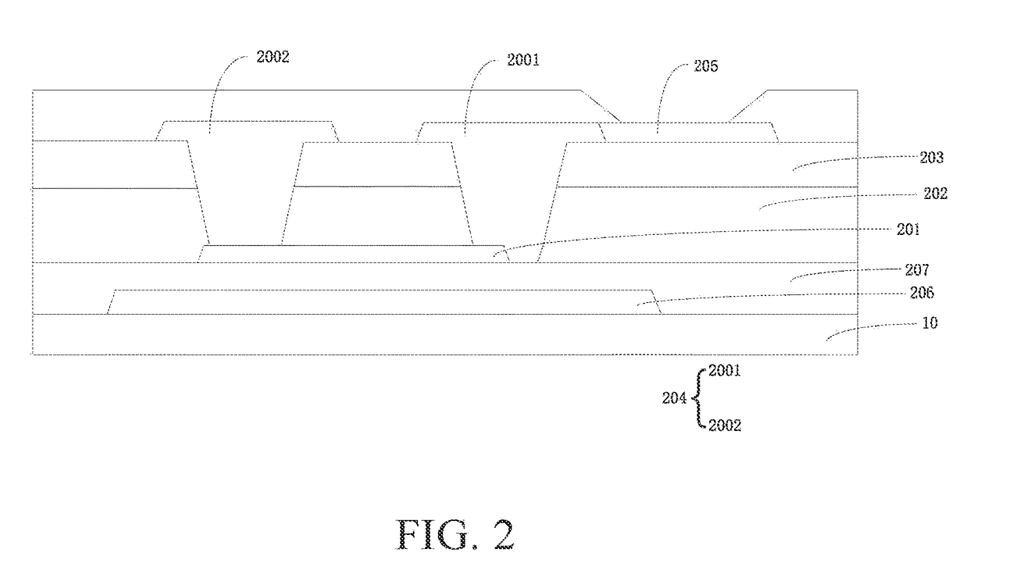
FIG. 2 is a second schematic sectional view of the OLED display panel provided by an embodiment of the present disclosure.

In an embodiment, as shown in FIG. 2, the active layer 201 is disposed on the gate insulating layer 207, the second source portion is in contact with a side surface of the first doped region, and a contact portion of the second source portion is disposed on the gate insulating layer 207.

Wherein, the source electrode 2001 wraps an end of the active layer 201.

Wherein, the drain electrode 2002 may be in contact with the gate insulating layer 207 through the drain via.

Wherein, the drain electrode 2002 may also directly contact the active layer 201 through the drain via, and not contact the gate insulating layer 207.

Figure 3:
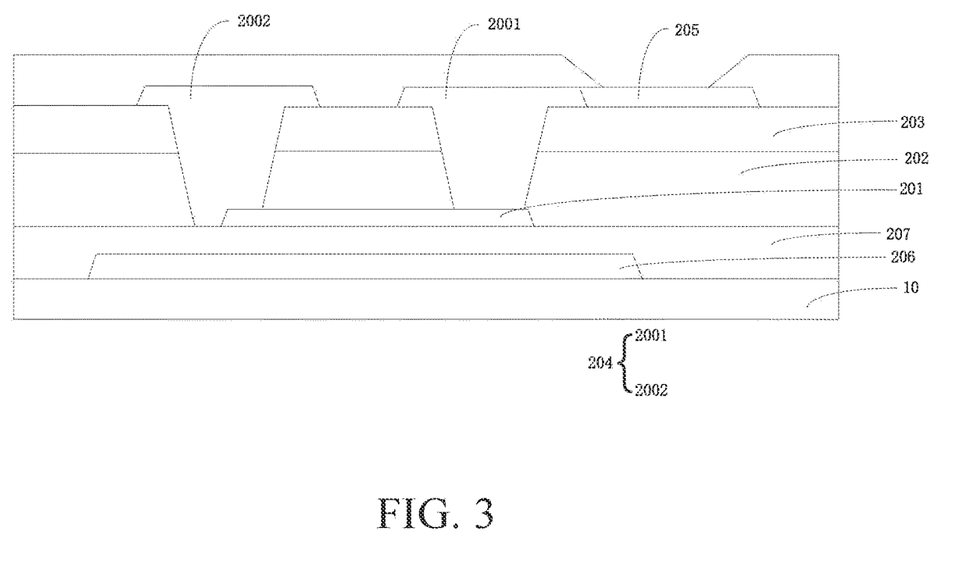
FIG. 3 is a third schematic sectional view of the OLED display panel provided by an embodiment of the present disclosure.

In an embodiment, as shown in FIG. 3, the active layer 201 is disposed on the gate insulating layer 207, the second drain portion is in contact with a side surface of the second doped region, and a contact portion of the second drain portion is disposed on the gate insulating layer 207.

Wherein, the drain electrode 2002 wraps an end of the active layer 201.

Wherein, the source electrode 2001 may be in contact with the gate insulating layer 207 through the drain via.

Wherein, the source electrode 2001 may also directly contact the active layer 201 through the source via, and not contact the gate insulating layer 207.

In an embodiment, a longitudinal cross-sectional shape of the source electrode and a longitudinal cross-sectional shape of the drain electrode are the same.

In an embodiment, as shown in FIG. 1, the active layer 201 includes a channel region, the first doped region, and the second doped region, and the first doped region and the second doped region are positioned at both ends of the channel region. An area of an orthographic projection of the active layer 201 of the first doped region on the substrate 10 is equal to an area of an orthographic projection of the active layer 201 of the second doped region on the substrate 10.

Wherein, the first doped region refers to a region where the source electrode 2001 contacts the active layer 201.

Wherein, in a same pixel unit, the channel region is a region of the active layer 201 between the adjacent first doped region and the adjacent second doped region.

Wherein, the second doped region refers to a region where the drain electrode 2002 contacts the active layer 201.

Wherein, the source electrode 2001 may be in contact with the gate insulating layer 207 through the source via.

Wherein, the source electrode 2001 may also directly contact the active layer 201 through the source via, and not contact the gate insulating layer 207.

Wherein, the drain electrode 2002 may be in contact with the gate insulating layer 207 through the drain via.

Wherein, the drain electrode 2002 may also directly contact the active layer 201 through the drain via, and not contact the gate insulating layer 207.

In an embodiment, as shown in FIG. 2, the active layer 201 includes a channel region, the first doped region, and the second doped region, and the first doped region and the second doped region are positioned at both ends of the channel region. An area of an orthographic projection of the active layer 201 of the first doped region on the substrate 10 is less than an area of an orthographic projection of the active layer 201 of the second doped region on the substrate 10.

Wherein, the first doped region refers to a region where the source electrode 2001 contacts the active layer 201.

Wherein, in a same pixel unit, the channel region is a region of the active layer 201 between the adjacent first doped region and the adjacent second doped region.

Wherein, the second doped region refers to a region where the drain electrode 2002 contacts the active layer 201.

Wherein, the source electrode 2001 may be in contact with the gate insulating layer 207 through the source via.

Wherein, the source electrode 2001 may also directly contact the active layer 201 through the source via, and not contact the gate insulating layer 207.

Wherein, the drain electrode 2002 may be in contact with the gate insulating layer 207 through the drain via.

Wherein, the drain electrode 2002 may also directly contact the active layer 201 through the drain via, and not contact the gate insulating layer 207.

In an embodiment, as shown in FIG. 3, the active layer 201 includes a channel region, the first doped region, and the second doped region, and the first doped region and the second doped region are positioned at both ends of the channel region. An area of an orthographic projection of the active layer 201 of the first doped region on the substrate 10 is greater than an area of an orthographic projection of the active layer 201 of the second doped region on the substrate 10.

Wherein, the first doped region refers to a region where the source electrode 2001 contacts the active layer 201.

Wherein, in a same pixel unit, the channel region is a region of the active layer 201 between the adjacent first doped region and the adjacent second doped region.

Wherein, the second doped region refers to a region where the drain electrode 2002 contacts the active layer 201.

Wherein, the source electrode 2001 may be in contact with the gate insulating layer 207 through the source via.

Wherein, the source electrode 2001 may also directly contact the active layer 201 through the source via, and not contact the gate insulating layer 207.

Wherein, the drain electrode 2002 may be in contact with the gate insulating layer 207 through the drain via.

Wherein, the drain electrode 2002 may also directly contact the active layer 201 through the drain via, and not contact the gate insulating layer 207.

In an embodiment, the active layer 201 is made of at least one of indium gallium zinc oxide, indium tin zinc oxide, indium gallium tin oxide, and indium gallium zinc tin oxide.

In an embodiment, a thickness of each of the source electrode 2001, the drain electrode 2002, and the anode 205 is equal to any value ranging between 500 angstroms and 10000 angstroms.

In an embodiment, a longitudinal cross-sectional shape of the source via is the same as that of the drain via.

In an embodiment, a shape of the source electrode 2001 and a shape of the drain electrode 2002 may be the same or different.

Wherein, the shape of the source electrode 2001 and the shape of the drain electrode 2002 may be the same.

Wherein, the shape of the source electrode 2001 and the shape of the drain electrode 2002 are both trapezoidal.

Wherein, the shape of the source electrode 2001 and the shape of the drain electrode 2002 are irregular geometric figures, and a width of an orthographic projection of the source electrode 2001 on the channel region is equal to a width of an orthographic projection of the drain electrode 2002 on the channel region.

Wherein, the shape of the source electrode 2001 and the shape of the drain electrode 2002 may also be different.

In an embodiment, the source electrode, the drain electrode, and the anode have a single-layer structure, and the source electrode, the drain electrode, and the anode are made of any one of molybdenum, aluminum, copper, and titanium.

In an embodiment, the source electrode, the drain electrode, and the anode have a multilayer structure, and the source electrode, the drain electrode, and the anode are made of any one of molybdenum/aluminum/molybdenum, aluminum/molybdenum, molybdenum/copper, and molybdenum titanium/copper.

In an embodiment, a color resist layer disposed on the planarization layer 203 is also included, and a material of the color resist layer is color resist organic material.

In an embodiment, the planarization layer 203 is made of organic material, and the planarization layer 203 is covered and disposed on the color resist layer.

In an embodiment, the anode may be made of indium tin oxide, silver or indium tin oxide material, or other anode materials.

In an embodiment, the anode 205 is provided with a pixel electrode layer thereon.

Wherein, a material of the pixel electrode layer may be hydrophobic material.

In an embodiment, the OLED display panel further includes a cathode layer disposed above the pixel definition layer.

In an embodiment, the OLED display panel further includes a light-emitting function layer and an encapsulation layer.

Wherein, the light-emitting layer includes an electron injection layer, an electron transport layer, a hole injection layer, and a hole transport layer.

Wherein, the encapsulation layer may include a first inorganic layer, a first organic layer, and a second inorganic layer.

Wherein, the first inorganic layer is disposed above the cathode layer.

In an embodiment, a longitudinal cross-sectional shape of the source electrode 2001 is any one of a polygon, a rectangle, and an arc shape.

In an embodiment, a longitudinal cross-sectional shape of the drain electrode 2002 is any one of a polygon, a rectangle, and an arc shape.

In an embodiment, a manufacturing material of the active layer 201 includes indium.

In an embodiment, the manufacturing material of the active layer 201 further includes zinc.

In an embodiment, the longitudinal cross-sectional shape of the source electrode 2001 and the longitudinal cross-sectional shape of the drain electrode 2002 include trapezoidal.

In an embodiment, the gate layer 206 may be a single-layer structure.

Wherein, a manufacturing material of the gate layer 206 is molybdenum, aluminum, copper, titanium and the like.

In an embodiment, the gate layer 206 may also be a multilayer structure.

Wherein, the manufacturing material of the gate layer 206 is a multilayer structure such as molybdenum/aluminum/molybdenum, aluminum/molybdenum, molybdenum/copper, and molybdenum titanium/copper.

In an embodiment, a thickness of the gate layer 206 is any value ranging between 500 angstroms and 10000 angstroms.

In an embodiment, the gate insulating layer 207 may be a single layer structure.

Wherein, a manufacturing material of the gate insulating layer 207 is a single layer of silicon nitride or a single layer of silicon dioxide In an embodiment, the gate insulating layer 207 may also have a double-layer structure.

In an embodiment, a thickness of the gate layer 206 is any value ranging between 1000 angstroms and 5000 angstroms.

In an embodiment, a thickness of the active layer 201 is any value ranging between 100 angstroms and 1000 angstroms.

In an embodiment, the passivation layer 202 may be a single layer structure.

Wherein, a manufacturing material of the passivation layer 202 is aluminum oxide or silicon dioxide.

In an embodiment, the passivation layer 202 may also be a multilayer structure.

Wherein, the manufacturing material of the passivation layer 202 is a multilayer structure of silicon dioxide/silicon nitride, silicon dioxide/aluminum oxide, and aluminum oxide/silicon nitride.

In an embodiment, a thickness of the passivation layer 202 is any value ranging between 1000 angstroms and 5000 angstroms.

In an embodiment, a thickness of the planarization layer 203 is any value ranging between 10000 angstroms and 50000 angstroms.

In an embodiment, the source-drain layer 204 and the anode 205 are arranged in a same layer, and materials of the source-drain layer 204 and the anode 205 may be a single-layer structure.

Wherein, the source-drain layer 204 and the anode 205 are made of molybdenum, aluminum, copper, titanium, or indium tin oxide. The source-drain layer 204 and the anode 205 may also made of a multilayer structure of molybdenum/aluminum/molybdenum, aluminum/molybdenum, molybdenum/copper, and molybdenum titanium/copper.

In an embodiment, a thickness of the source-drain layer 204 and the anode 205 is any value ranging between 500 angstroms and 10000 angstroms.

Wherein, regions of the source electrode 2001, the drain electrode 2002, and the anode can be defined by using a yellow light process.

In an embodiment, a thickness of the pixel definition layer is any value ranging between 10000 angstroms and 50000 angstroms.

The OLED display panel provided by the embodiments of the present disclosure includes a substrate 10, and a gate electrode 206, an active layer 201, a source electrode 2001, and a drain electrode 2002 of a thin film transistor (TFT) device disposed on the substrate, and an anode 205 of an OLED device disposed on the substrate; wherein the source electrode 2001, the drain electrode 2002, and the anode 205 are formed in a same layer, and the anode 205 is connected to the source electrode 2001. The source electrode 2001, the drain electrode 2002, and the anode 205 are arranged in a same layer, and the source electrode 2001 and the drain electrode 2002 are respectively contacted with the active layer 201 through the source via and the drain via. Under a premise of ensuring a normal switching function of the transistor, the source-drain electrodes and the anode are formed through a single process, which relieves the technical problem that the conventional OLED display panels need to use multiple masks.

Structures provided in the embodiments of the present disclosure have been described in detail above. Specific examples are used herein to explain principle and implementation of the present disclosure. The description of the above embodiments is only used to help understand the technical solution of the present disclosure and its core ideas; it will be understood by those of ordinary skill in the art that the technical solutions described in the foregoing embodiments may be modified or equivalently substituted for some or all of the technical features, and the modifications or substitutions do not depart from the scope of the technical solutions of the embodiments of the present disclosure.

What is claimed is:

1. An organic light emitting diode (OLED) display panel, comprising:
    a substrate, and
    a gate electrode, an active layer, a source electrode, and a drain electrode of a thin film transistor (TFT) device disposed on the substrate; and
    an anode of an OLED device disposed on the substrate;
    wherein the source electrode, the drain electrode, and the anode are formed in a same layer, and the anode is connected to the source electrode,
    wherein the source electrode, the drain electrode, and the anode have a multilayer structure, and the source electrode, the drain electrode, and the anode are made of any one of molybdenum/copper, and molybdenum titanium/copper, and
    wherein the TFT device further comprises:
    a gate insulating layer at least covering the gate electrode, and the active layer being disposed on the gate insulating layer;
    a passivation layer disposed on the gate insulating layer and covering the active layer;
    a planarization layer disposed on the passivation laver;
    a source via penetrating the passivation layer and the planarization layer to a first doped region of the active layer, wherein the source electrode is disposed on an upper surface of the planarization layer, and the source electrode is connected to the first doped region through the source; and a drain via penetrating the passivation layer and the planarization layer to a second doped region of the active layer, wherein the drain electrode is disposed on a surface of the planarization layer, and the drain electrode is connected to the second doped region through the drain via.

2. The OLED display panel in claim 1, wherein the source electrode is in contact with the first doped region of the active layer through the source via, and the drain electrode is in contact with the second doped area of the active layer through the drain via;

wherein the source electrode comprises a first source portion disposed above the planarization layer and a second source portion disposed in the source via, and the drain electrode comprises a first drain portion disposed above the planarization layer and a second drain portion disposed in the drain via.

3. The OLED display panel in claim 2, wherein the second source portion is in contact with a side surface of the first doped region, and a contact portion of the second source portion is disposed on the gate insulating layer.

4. The OLED display panel in claim 2, wherein the second drain portion is in contact with a side surface of the second doped region, and a contact portion of the second drain portion is disposed on the gate insulating layer.

5. The OLED display panel in claim 2, wherein the active layer comprises a channel region, the first doped region, and the second doped region, the first doped region and the second doped region are positioned at both ends of the channel region, and an area of an orthographic projection of the active layer of the first doped region on the substrate is equal to an area of an orthographic projection of the active layer of the second doped region on the substrate.

6. The OLED display panel in claim 1, wherein the active layer is made of at least one of indium gallium zinc oxide, indium tin zinc oxide, indium gallium tin oxide, and indium gallium zinc tin oxide.

7. The OLED display panel in claim 1, wherein a thickness of each of the source electrode, the drain electrode, and the anode is equal to any value ranging between 500 angstroms and 10000 angstroms.

8. An OLED display device; comprising an OLED display panel, and the OLED display panel comprising:

a substrate, and a gate electrode, an active layer, a source electrode, and a drain electrode of a TFT device disposed on the substrate; and an anode of an OLED device disposed on the substrate;

wherein the source electrode, the drain electrode, and the anode are manufactured in a same layer, and the anode is connected to the source electrode, wherein the source electrode, the drain electrode, and the anode have a multilayer structure, and the source electrode, the drain electrode, and the anode are made of any one of molybdenum/copper, and molybdenum titanium/copper, and wherein the TFT device further comprises:

a gate insulating layer at least covering the gate electrode, and the active layer being disposed on the gate insulating layer;

a passivation layer disposed on the gate insulating layer and covering the active layer;

a planarization layer disposed on the passivation layer, a source via penetrating the passivation layer and the planarization layer to a first doped region of the active layer, wherein the source electrode is disposed on an upper surface of the planarization layer, and the source electrode is connected to the first doped region through the source via; and a drain via penetrating the passivation layer and the planarization layer to a second doped region of the active layer, wherein the drain electrode is disposed on a surface of the planarization layer, and the drain electrode is connected to the second doped region through the drain via.

9. The OLED display device in claim 8, wherein the source electrode is in contact with the first doped region of the active layer through the source via, and the drain electrode is in contact with the second doped area of the active layer through the drain via;

wherein the source electrode comprises a first source portion disposed above the planarization layer and a second source portion disposed in the source via, and the drain electrode comprises a first drain portion disposed above the planarization stop layer and a second drain portion disposed in the drain via.

10. The OLED display device in claim 9, wherein the second source portion is in contact with a side surface of the first doped region, and a contact portion of the second source portion is disposed on the gate insulating layer.

11. The OLED display device in claim 9, wherein the second drain portion is in contact with a side surface of the second doped region, and a contact portion of the second drain portion is disposed on the gate insulating layer.

12. The OLD display device in claim 9, wherein the active layer comprises a channel region, the first doped region, and the second doped region, the first doped region and the second doped region are positioned at both ends of the channel region, and an area of an orthographic projection of the active layer of the first doped region on the substrate is equal to an area of an orthographic projection of the active layer of the second doped region on the substrate.

13. The OLED display device in claim 8, wherein the active layer is made of at least one of indium gallium zinc oxide, indium tin zinc oxide, indium gallium tin oxide, and indium gallium zinc tin oxide.

14. The OLED display device in claim 8, wherein a thickness of each of the source electrode, the drain electrode, and the anode is equal to any value ranging between 500 angstroms and 10000 angstroms.

* * * * *

UNITED STATES PATENT AND TRADEMARK OFFICE
CERTIFICATE OF CORRECTION

PATENT NO. : 11,296,163 B2  
APPLICATION NO. : 16/980913  
DATED : April 5, 2022  
INVENTOR(S) : Shuning Zhao et al.

Page 1 of 1

It is certified that error appears in the above-identified patent and that said Letters Patent is hereby corrected as shown below:

On the Title Page

Insert the following Item (30) Foreign Application Priority Data:  
--Apr. 24, 2020 (CN)................... 202010332912.4--

Signed and Sealed this  
Eleventh Day of June, 2024

Katherine Kelly Vidal  
*Director of the United States Patent and Trademark Office*